United States Patent [19]

Kobayashi et al.

[11] Patent Number: 5,184,037
[45] Date of Patent: Feb. 2, 1993

[54] MAGNETOSTRICTION TYPE ACTUATOR

[75] Inventors: Tadahiko Kobayashi; Masashi Sahashi, both of Yokohama, Japan

[73] Assignee: Kabushiki Kaisha Toshiba, Kawasaki, Japan

[21] Appl. No.: 659,172

[22] Filed: Feb. 22, 1991

[30] Foreign Application Priority Data

| Feb. 23, 1990 | [JP] | Japan | 2-40928 |
| Feb. 23, 1990 | [JP] | Japan | 2-40929 |
| Feb. 23, 1990 | [JP] | Japan | 2-40930 |
| Mar. 30, 1990 | [JP] | Japan | 2-83220 |

[51] Int. Cl.$^5$ .............................................. H01L 41/12
[52] U.S. Cl. .................................... 310/26; 318/118
[58] Field of Search ............... 310/26; 318/114, 118; 367/165, 168

[56] References Cited

U.S. PATENT DOCUMENTS

| 4,438,509 | 3/1984 | Butler et al. | 367/156 |
| 4,845,450 | 7/1989 | Porzio et al. | 335/215 |
| 4,975,643 | 12/1990 | Buchwald | 324/207.12 |
| 5,043,685 | 8/1991 | Nyce | 333/148 |

Primary Examiner—Emanuel T. Voeltz
Assistant Examiner—Judson H. Jones
Attorney, Agent, or Firm—Oblon, Spivak, McClelland, Maier & Neustadt

[57] ABSTRACT

A magnetstriction type actuator is capable of reducing an input power loss and increasing an output, which actuator is reduced in size and is applicable to a vibrator. The actuator comprises: displacement generating means formed of a magnetic substance having magnetostriction; a movable member fixed to the displacement generating means, which movable member is movable in the direction of displacement of the displacement generating means; first magnetic field generating means, provided around the displacement generating means, for applying a magnetic field to the displacement generating means and second magnetic field generating means for applying a magnetic bias; a magnetic circuit component for constituting, along with the movable member, a main part of a closed magnetic circuit, within which magnetic circuit component the displacement generating means and the magnetic field generating means are stored; and an elastic member, disposed within the magnetic circuit component, for applying a compression force to the displacement generating means via the movable member in the direction of displacement of the displacement generating means.

15 Claims, 17 Drawing Sheets

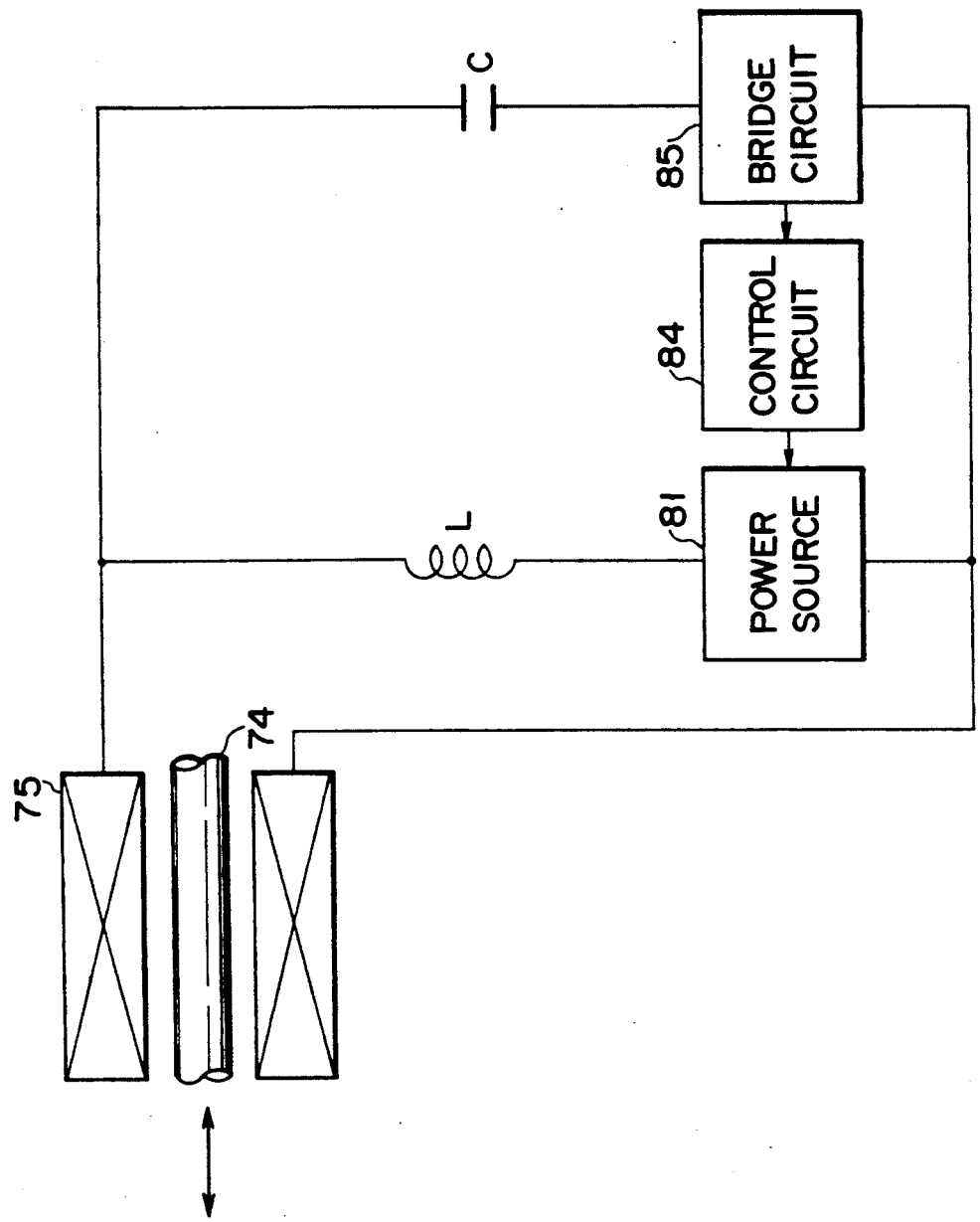
F I G. 16

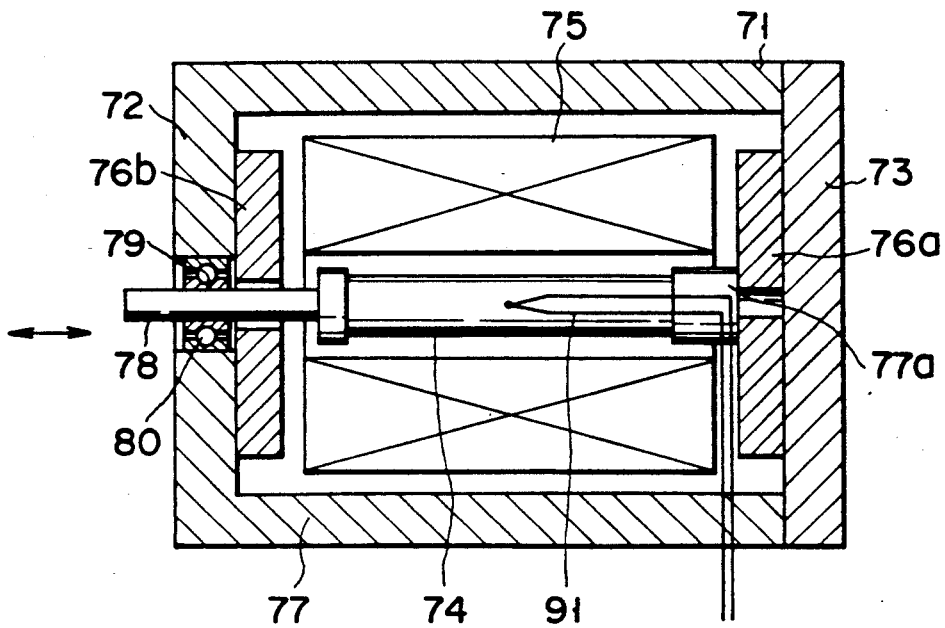
F I G. 18
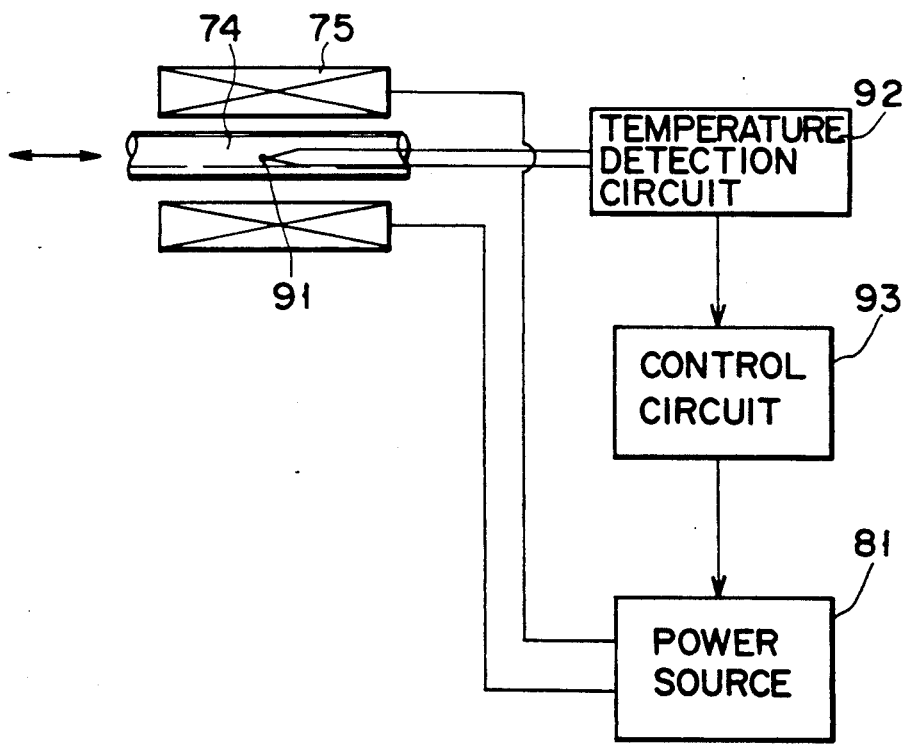
F I G. 19

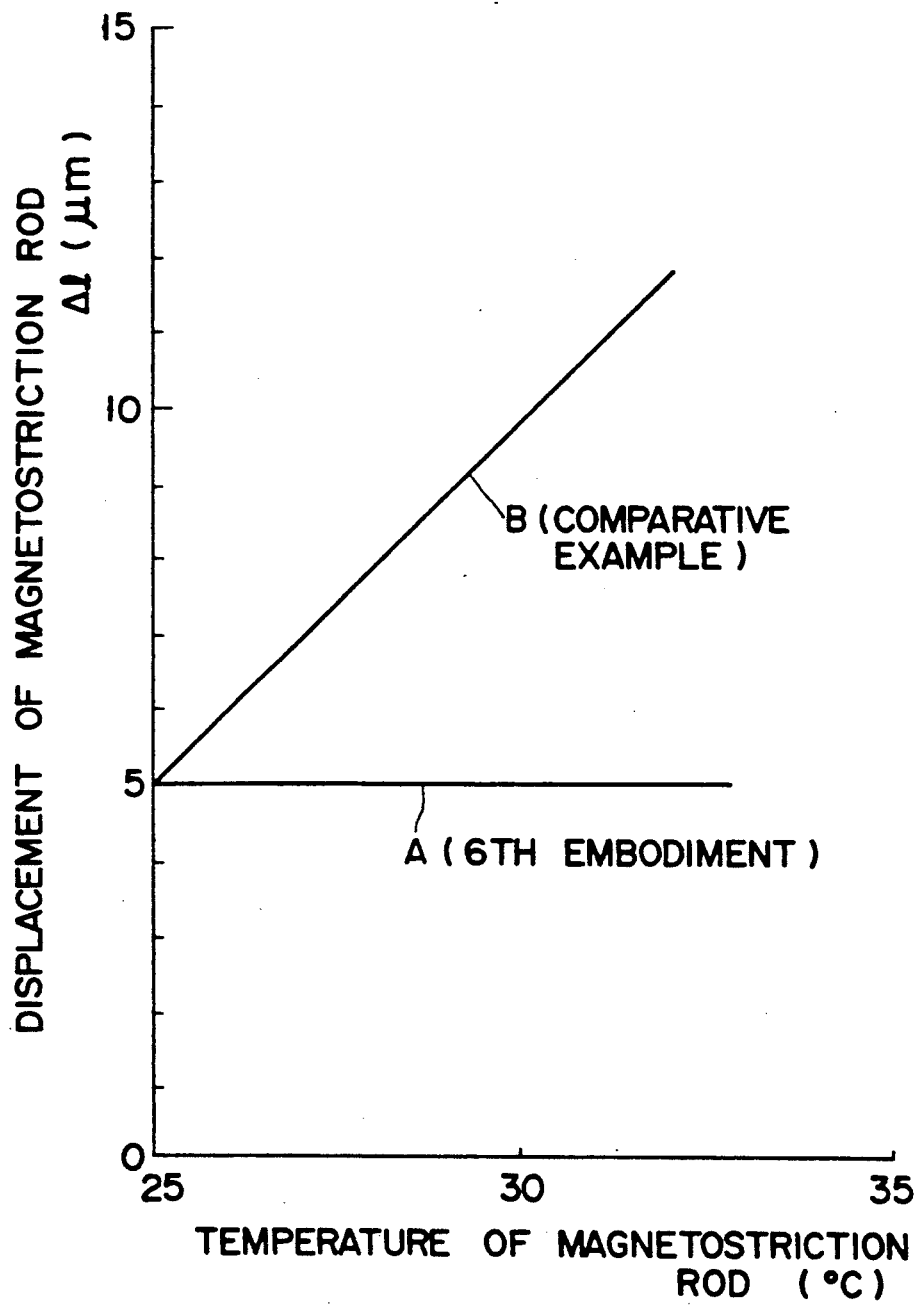
F I G. 20

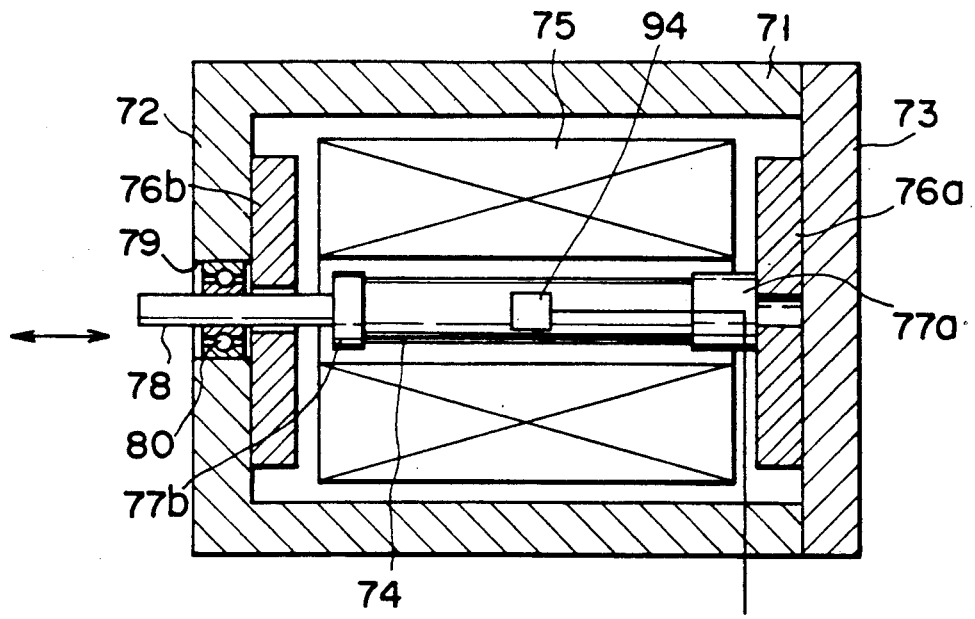
F I G. 21
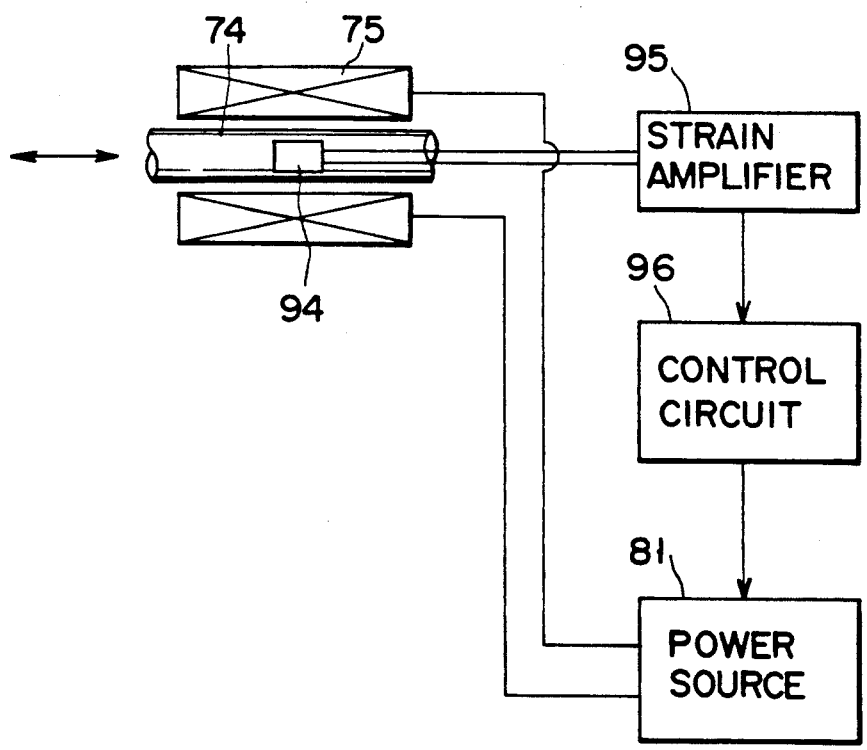
F I G. 22

MAGNETOSTRICTION TYPE ACTUATOR

BACKGROUND OF THE INVENTION

1. Field of the Invention

The present invention relates to a magnetostriction type actuator having a magnetic substance capable of generating magnetostriction upon application of external magnetic field.

2. Description of the Related Art

As a conventional actuator for generating vibration or displacement, there is known a piezoelectric actuator having a displacement generating element of a piezoelectric material, such as PZT, which element is supplied with control voltage. There are also known an electromagnetic actuator utilizing a principle of a loudspeaker, and a magnetostriction type actuator utilizing a magnetostriction phenomenon.

There is a demand that the actuator for generating vibration or displacement be small in size and be capable of generating a high power. Particular attention is paid to a magnetostriction type actuator having a displacement generating element, which can meet such a demand, that is, which is made of a magnetic material capable of generating magnetostriction and higher in rigidity than the aforementioned piezoelectric material.

The magnetic material used in this magnetostriction type actuator is conventionally composed of a Ni-base alloy, a Fe-Al-base alloy or a ferrite. It has recently been reported that a rare earth metal-transition metal-base giant magnetostrictive alloy, which can generate a displacement 10 or more times greater than the displacement of the aforementioned magnetostrictive material, can be used. The magnetostriction type actuator comprises means for applying a control magnetic field to the magnetostrictive material. As such means for applying magnetic field, a magnetic circuit including an electromagnet, which is capable of easily controlling a magnetic field by supply of control current, is widely used.

In order to enable the magnetostriction type actuator to generate a strong vibration wave, it is necessary to greatly displace the magnetostrictive material. In order to greatly displace the magnetostrictive material, however, it is necessary to increase control current, resulting in an increase in power supply. In addition, the size of the actuator itself increases. Furthermore, where the magnetostrictive alloy is used, it is necessary to utilize supplied power to a maximum level. In the prior art, however, the structure of the magnetic circuit has not sufficiently improved. Consequently, the reduction in size and increase in output power has not been achieved.

On the other hand, the development of an actuator capable of generating a micron-order fine displacement has been desired in accordance with the development of instrumentation technology and precision instruments. Regarding this actuator, it is required that an absolute drive displacement amount, precision control property and toughness be high.

As an actuator meeting such requirements, there is proposed a magnetostriction type actuator having a magnetic body (magnetic material) to which a control magnetic field is applied by the same magnetic circuit as has been mentioned above. The actuator using this magnetic body is provided with means for applying a control magnetic field to the magnetic body. As such means for applying magnetic field, a magnetic circuit including an electromagnet, which is capable of easily controlling a magnetic field by supply of control current, is used.

In the magnetostrictive actuator, however, if the property of the magnetic body is adversely affected by strain variation due to external influence, the stability and controllability of the actuator is decreased. For example, if a load is applied to the magnetic body, the relationship between the amount of displacement of the magnetic body and the applied magnetic field varies, compared to the case where no load is applied. The reason for this is that reverse effect of magnetostriction is caused to occur, and the stability and controllability is degraded owing to the variation of the load. In addition, when a control current is supplied to the magnetic circuit in order to displace the magnetic body, the magnetic circuit is heated by the control current and consequently the magnetic body is thermally expanded. Thus, the amount of displacement varies, and it is difficult to generate a micron-order fine displacement with high stability and controllability.

SUMMARY OF THE INVENTION

An object of the present invention is to provide a magnetostriction type actuator capable of reducing an input power loss and increasing an output, which actuator is reduced in size and is applicable to an vibrator, etc.

Another object of the invention is to provide a magnetostriction type actuator capable of being finely displaced and driven with high stability and controllability, irrespective of thermal disturbance, load, etc., which affect a strain variation of a displacement generating means.

According to the present invention, there is provided a magnetostriction type actuator comprising:

displacement generating means formed of a magnetic substance having magnetostriction;

a movable member fixed to said displacement generating means, which movable member is movable in the direction of displacement of the displacement generating means;

magnetic field generating means, provided around the displacement generating means, for applying a magnetic field to the displacement generating means;

magnetic circuit component, along with said movable member, a main part of a closed magnetic circuit, within which magnetic circuit component said displacement generating means and said magnetic field generating means are stored; and an elastic member, disposed within said magnetic circuit component, for applying a compression force to the displacement generating means via the movable member in the direction of displacement of the displacement generating means.

As the magnetic substance, a conventionally used material such as a Ni-base alloy, a Fe-Al-base alloy or a ferrite may be used.

In order to reduce the size of the vibrator or the like and increase the output power, it is desirable that the magnetic substance consists of a giant magnetostrictive alloy composed of a rare earth metal-transition metal base Laves-phase intermetallic compound. The giant magnetostrictive alloy has a composition which satisfies the atomic ratio of

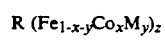

R $(Fe_{1-x-y}Co_xM_y)_z$ (where R is at least one element selected from rare earth metals including yttrium; M is at least one selected from the group consisting of Ni, Mg, Al, Ga, Zn, V, Zr, Hf, Ti, Nb, Cu, Ag, Sn, Mo, Si and B; and x, y and z represent $0 \leq x \leq 0.95$, $0 \leq y \leq 0.6$, and $1.5 \leq z \leq 4.0$).

Specific examples are a Tb-Dy.Fe base alloy and a Tb-Dy.Fe-Mn alloy. It is also possible to use magnetostrictive alloys having negative magnetostriction such as $SmFe_2$ and $ErFe_2$.

The displacement generating means is, in practice, a body made of the magnetic substance. The body may be, for example, a solid cylindrical, a hollow cylindrical, a prismatic, or a multilayer rod. However, where an oscillation of several kHz or more is applied, it is desirable to use a hollow cylindrical or a multilayer rod capable of enhancing the skin effect of the magnetic body and suppressing eddy current loss.

It is desirable to constitute the magnetic field generating means by first magnetic field generating means for generating a displacement in the magnetic body and second magnetic field generating means for applying a magnetic bias to the magnetic body. The first magnetic field generating means is, for example, a solenoid coil, and the second magnetic field generating means is, for example, a permanent magnet or an electromagnet.

It is desirable that the solenoid coil used as first magnetic field generating means meet the condition for the shape, $0.5Lm < Lc < 2Lm$, where Lm is the length of the magnetic body and Lc is the length of the solenoid coil. The reason is as follows. If the length Lc of the solenoid coil is less than 0.5Lm, it becomes difficult to uniformly apply the magnetic field generated by the solenoid coil to the magnetic body. On the other hand, if the length Lc of the coil exceeds 2Lm, the application efficiency of magnetic field increases but, when the invention is applied to a vibrator, the size of the vibrator may increase. In order to enhance the reliability of the actuator, it is desirable that a gap be provided between the solenoid coil and the magnetic body in a non-contact type structure. However, if the efficiency needs to be increased, a close contact type structure wherein the solenoid coil is wound directly around the magnetic body may be adopted.

The elastic member may be a spring or a resin material. The resin material is, for example, general-purpose rubber or silicone rubber.

According to the magnetostriction type actuator of the present invention, the magnetic body with magnetostriction and the magnetic field generating means are stored within the magnetic circuit component which constitute, along with the movable member, a main part of the closed magnetic circuit. Thus, a magnetic field can effectively applied from the magnetic field generating means to the magnetic body. Thus, the efficiency of the output power of a movable member fixed to the magnetic body, in relation to the input power, can be increased. In addition, the magnetic circuit component can function also as means for applying a compression stress to the magnetic body via the elastic member, the magnetostriction type actuator can be reduced in size and constituted as one body.

Furthermore, according to the present invention, there is provided a magnetostriction type actuator comprising:

displacement generating means formed of a magnetic substance having magnetostriction;

magnetic field generating means, provided around the displacement generating means, for applying a magnetic field to the displacement generating means;

detection means for detecting a factor which influences a strain variation in the displacement generating means; and control means, connected to the detection means, for controlling a magnetic field applied from the magnetic field generating means to the displacement generating means, on the basis of a detection signal supplied from the detection means.

The displacement generating means is, in practice, a body made of the magnetic substance.

The detection means detects a factor which influences a strain variation, for example, a magnetic characteristic of the magnetic body, the temperature thereof, or the strain thereof.

According to this actuator of the invention, in case the magnetic field generating means is heated by current supplied thereto and the magnetic body is thermally deformed, or in case the magnetic body is deformed by vibration or friction, the detection means for detecting a factor liable to affect a strain variation in the magnetic body, for example, strain detection means, detects the strain (absolute value of displacement) of the magnetic substance. On the basis of the strain value detected by the strain detection means, the control means controls a control current supplied to for example, the magnetic field generating means. Thus, the amount of magnetic field applied to the magnetic body by the magnetic field generating means can be controlled. Therefore, fine displacement can be effected with high stability and controllability and precise positioning can be ensured, irrespective of thermal disturbance, vibration, etc., which affect the strain variation in the magnetic body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a schematic diagram showing another drive circuit used in the actuator according to the sixth embodiment;

FIG. 18 is a cross-sectional view showing a magnetostriction type actuator according to a seventh embodiment of the invention, which is used for fine displacement;

FIG. 19 is a schematic diagram showing a drive circuit used in the actuator shown in FIG. 18;

FIG. 20 is a characteristic graph showing a relationship between the temperature of a magnetostriction rod and the displacement of the rod with respect to the magnetostriction type actuators according to the seventh embodiment and a comparative example;

FIG. 21 is a cross-sectional view showing a magnetostriction type actuator according to an eighth embodiment of the invention, which is used for fine displacement;

FIG. 22 is a schematic diagram showing a drive circuit used in the actuator shown in FIG. 21;

DETAILED DESCRIPTION OF THE PREFERRED EMBODIMENTS

Preferred embodiments of the present invention will now be described in detail with reference to the accompanying drawings.

First Embodiment

Figure 1:
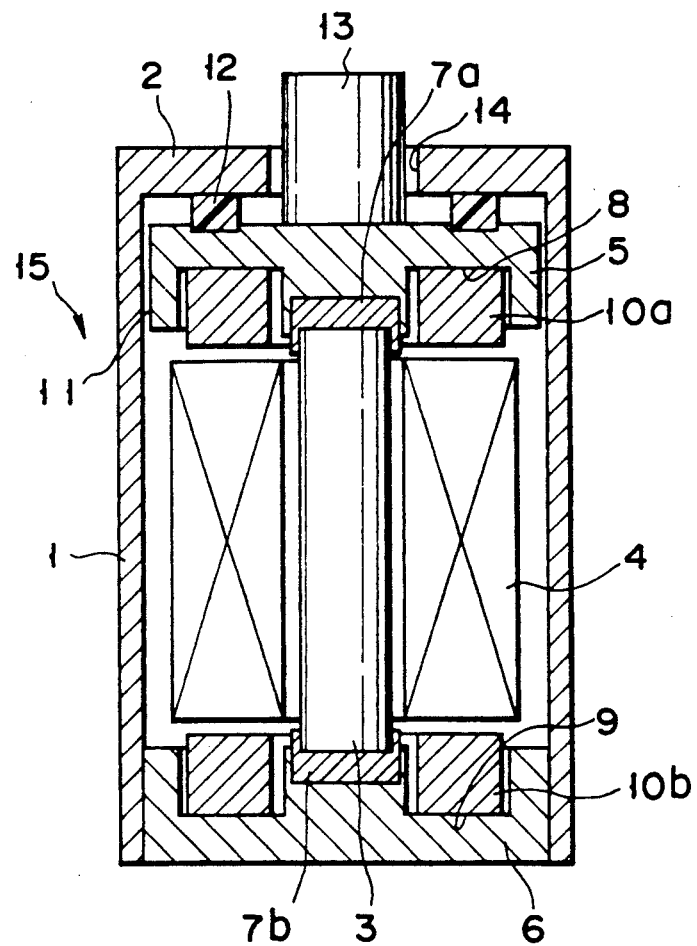
FIG. 1 is a cross-sectional view showing a vibrator to which a magnetostriction type actuator according to a first embodiment of the present invention is applied.

FIG. 1 is a cross-sectional view showing a vibrator 15 to which a magnetostriction type actuator according to the present invention is applied. A cylindrical yoke 1, which is a main part of a magnetic circuit, has a disc-like seal portion 2 at one end. A magnetostriction rod 3 made of a magnetic substance with magnetostriction, which has a diameter of, e.g. 5 mm and a length of, e.g. 25 mm, is situated within the cylindrical yoke 1 so as to extend in the longitudinal direction of the yoke 1. The magnetostriction rod 3 is made of a giant magnetostrictive alloy, e.g., $Tb_{0.28}Dy_{0.72}Fe1.95$. A solenoid coil 4, serving as first magnetic field generating means for displacing the magnetostriction rod 3, is located between the magnetostriction rod 3 and cylindrical yoke 1. The solenoid coil 4 has a length which is equal to 0.9 times the length of the magnetostriction rod 3, thus enabling a magnetic field to be applied uniformly to the magnetostriction rod 3. The coil 4 has a multilayer uniform winding structure wherein the coil 4 extends from one end of rod 3 to the other end, with a predetermined gap kept between the rod 3 and coil 4.

A disc-like movable yoke 5 and a fixed yoke 6 are arranged within the yoke 1 so as to be located at both longitudinal ends of the magnetostriction rod 3. The yokes 5 and 6 and both ends of the rod 3 are fixed by interposing therebetween the spacers 7a and 7b made of, e.g., acetal resin. The spacers 7a and 7b protect both ends of the rod 3. Those surfaces of the movable yoke 5 and fixed yoke 6, which face the magnetostriction rod 3, have annular grooves 8 and 9. Annular permanent magnets 10a and 10b, serving as second magnetic field generating means, are disposed in the grooves 8 and 9. The combination of the cylindrical yoke 1, movable yoke 5 and fixed yoke 6 serves mainly as a closed magnetic circuit for the solenoid coil 4 and permanent magnets 10a and 10b.

A gap 11 is provided between the movable yoke 5 and the inner peripheral surface of the cylindrical yoke 1. It is desirable that the gap 11 be as narrow as possible, in order to constitute the closed magnetic circuit with reduced magnetic resistance. An annular elastic member 12 made of, e.g. silicone rubber, is interposed between the movable yoke 5 and the seal portion 2 of yoke 1. By virtue of the elasticity of the elastic member 12, the movable yoke 5 is movable in the direction of displacement of the magnetostriction rod 3. The characteristics of the vibrator 15 depend largely on the elastic modulus of the elastic member 12, it is desirable that the elastic modulus be set to an optimal value. The fixed yoke 6 is tightly fitted in the cylindrical yoke 1 from the open end of yoke 1. By virtue of the tight fitting of the fixed yoke 6, the magnetostriction rod 3 is fixed with pressure on the movable 5, to which elastic force is applied by the elastic member 12, and also is clamped by the elastic member 12 (so-called "Langevin type structure"). In order to constitute the vibrator with high efficiency, it is desirable that the weight of the fixed yoke 6 be sufficiently greater than that of the movable yoke 5.

An output end 13 for transmitting oscillation is fixed on the movable yoke 5. The output end 13 is projected outwards through a hole 14 formed in the disc-like seal portion 2 of cylindrical yoke 1.

According to the vibrator 15 having the above structure, the output end 13 is mechanically fixed on a desired object to which oscillation is transmitted. A control current is supplied to the solenoid coil 4, thereby displacing the magnetostriction rod 3 made of $Tb_{0.28}Dy0.72Fe1.95$. Consequently, a predetermined oscillation is transmitted from the output end 13 which is fixed to the magnetostriction rod 3 via the spacer 7a and movable yoke 5. When control current is supplied to the coil 4, the permanent magnets 10a and 10b located at both ends of the rod 3 apply a predetermined DC magnetic bias to the rod 3. By virtue of the application of DC magnetic bias, a vibration can be generated from the output end 13 in accordance with the negative/positive control current supplied to the solenoid coil 4. The magnetostriction rod 3 can have a maximum displacement rate in low magnetic field. As a result, a linear relationship can be established between the control current to the coil 4 and the displacement of the rod 3. Also in the case where the magnetostriction rod 3 was made of a giant magnetostrictive alloy of $Tb_{0.5}Dy0.5(Fe_{0.8}Mn_{0.2})_{1.9}$, an excellent vibrator was obtained.

According to the above vibrator 15, the closed magnetic circuit is constituted by the cylindrical yoke 1, movable yoke 5 and fixed yoke 6. The magnetostriction rod 3, solenoid coil 4 and permanent magnets 10a and 10b are stored within the cylindrical yoke 1, movable yoke 5 and yoke 6, thereby enhancing the efficiency of applying a magnetic field from the coil 4 to the rod 3 and the efficiency of applying a DC magnetic bias from the permanent magnets 10a and 10b. In addition, the closed magnetic circuit can prevent leakage of magnetic field to the outside. As a result, the efficiency of output power in relation to input power can remarkably be increased.

The structural parts (cylindrical yoke 1, movable yoke 5 and fixed yoke 6) of the closed magnetic circuit are combined with the elastic member 12, thereby fixing the magnetostriction rod 3 on the movable yoke 5 with pressure and clamping the rod 3 by the elastic member 12. In other words, the "Langevin type structure" is obtained. As a result, the size of the vibrator 15 can be reduced. In addition, since the elastic member 12 applies a compressive stress to the magnetostriction rod 3 in the direction of displacement, the value of stress to the rod 3 can freely be determined by the degree to which the fixed yoke 6 is inserted into the cylindrical yoke 1.

By forming the spacers 7a and 7b of acetal resin, which fix both ends of the rod 3 to the movable yoke 5 and fixed yoke 6, the spacers 7a and 7b and elastic member 12 can cooperate to surely fix the rod 3 on the movable yoke 5. However, if the spacers 7a and 7b are formed of an extremely soft material, the displacement of the rod 3 is absorbed by the spacers 7a and 7b and considerably lost. Consequently, the efficiency of the vibrator 15 is lowered. It is thus desirable that the spacers 7a and 7b be formed of a material having suitable rigidity.

Figure 2:
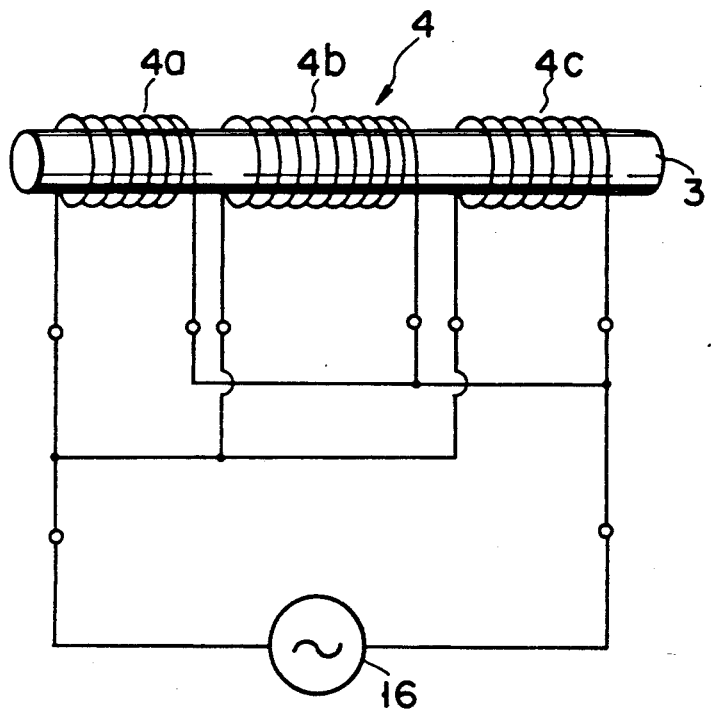
FIG. 2 is a schematic diagram showing a structure of another solenoid coil used in the actuator shown in FIG. 1.
Figure 3:
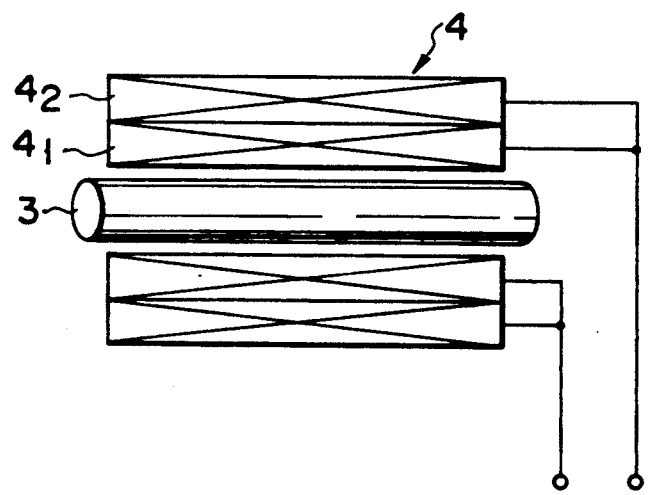
FIG. 3 is a schematic diagram showing a structure of still another solenoid coil used in the actuator shown in FIG. 1.

In the first embodiment, the solenoid coil 4 serving as first magnetic field generating means has a multilayer uniform winding structure. In the coil 4 having this structure, a spatial distribution of generated magnetic field has a highest value at the center portion of the coil and has gradually decreasing values towards the end portions. When control current is supplied to the solenoid coil, it is necessary to set the values of DC resistance and inductance at optical values, because of the conditions of power supply. Under the situation, it is possible to constitute the solenoid coil 4 by three divided coils 4a, 4b and 4c connected to a power source 16, as shown in FIG. 2, thereby applying a uniform magnetic field to the magnetostriction rod 3. In addition, as shown in FIG. 2, by connecting the coils 4a, 4b and 4c in parallel to the power source 16, the DC resistance and inductance can be reduced to optimal values. Furthermore, the same advantages can be obtained by constituting the solenoid coil 4 by double multilayer uniform winding coils $4_1$ and $4_2$, as shown in FIG. 3, and connecting the coils $4_1$ and $4_2$ in parallel to a power source (not shown).

Figure 4:
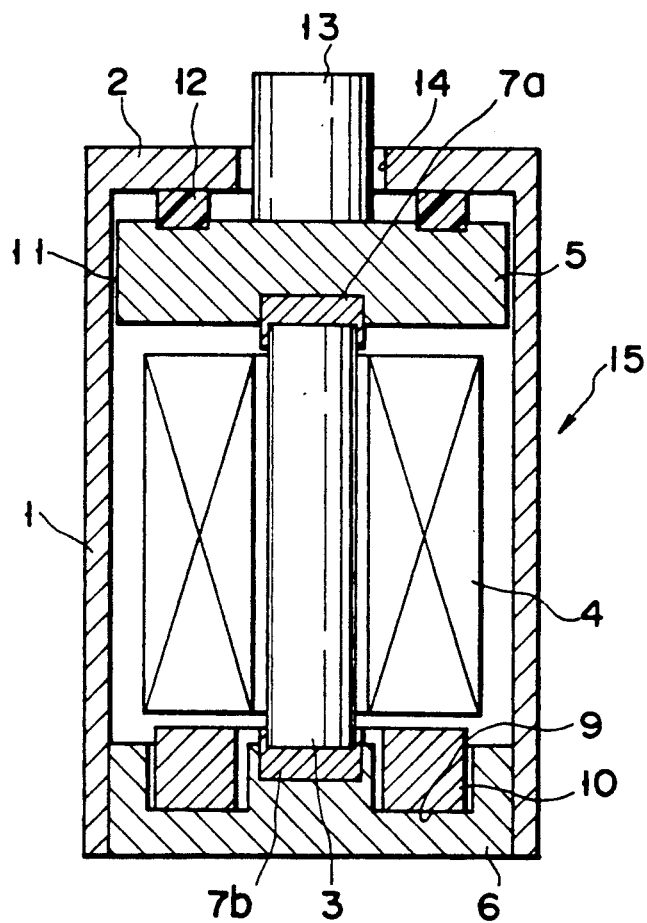
FIG. 4 is a cross-sectional view showing a vibrator according to a modification of the first embodiment.

In the first embodiment, permanent magnets 10a and 10b are arranged at both ends of the magnetostriction rod 3; however, as is shown in FIG. 4, single permanent magnet 10 may be provided at only that end of the rod 3 which is near the fixed yoke 6.

In the first embodiment, the gap 11 between the cylindrical yoke 1 and movable yoke 5 is made as narrow as possible, thereby constituting the closed magnetic circuit with reduced magnetic resistance; however, this invention is not limited to this technique. For example, a magnetic fluid may be injected into the gap 11 between the cylindrical yoke 1 and movable yoke 5, thereby reducing magnetic resistance and enhancing the efficiency of the output power in relation to the input power. The magnetic fluid is generally composed of magnetic ultrafine particles of iron oxide, a surface-active agent and a dispersing solvent. Preferably, the use of ferromagnetic metallic colloid can remarkably reduce magnetic resistance at the gap 11. By altering the component concentration of the magnetic fluid, the viscosity of the fluid can be controlled, and thereby the fluid injected in the gap 11 can function as an elastic body.

In the first embodiment, the fixed yoke 6 is inserted into the cylindrical yoke 1, and compression stress is applied to the magnetostriction rod 3 by the elastic member 12. However, it is possible to form the fixed yoke 6 and cylindrical yoke 1 as one body, separate the disc-like seal portion 2 from the yoke 1, attach the seal portion to the yoke 1 by means of screws or the like, and apply compression stress to the magnetostriction rod 3 by the elastic member.

Second Embodiment

Figure 5:
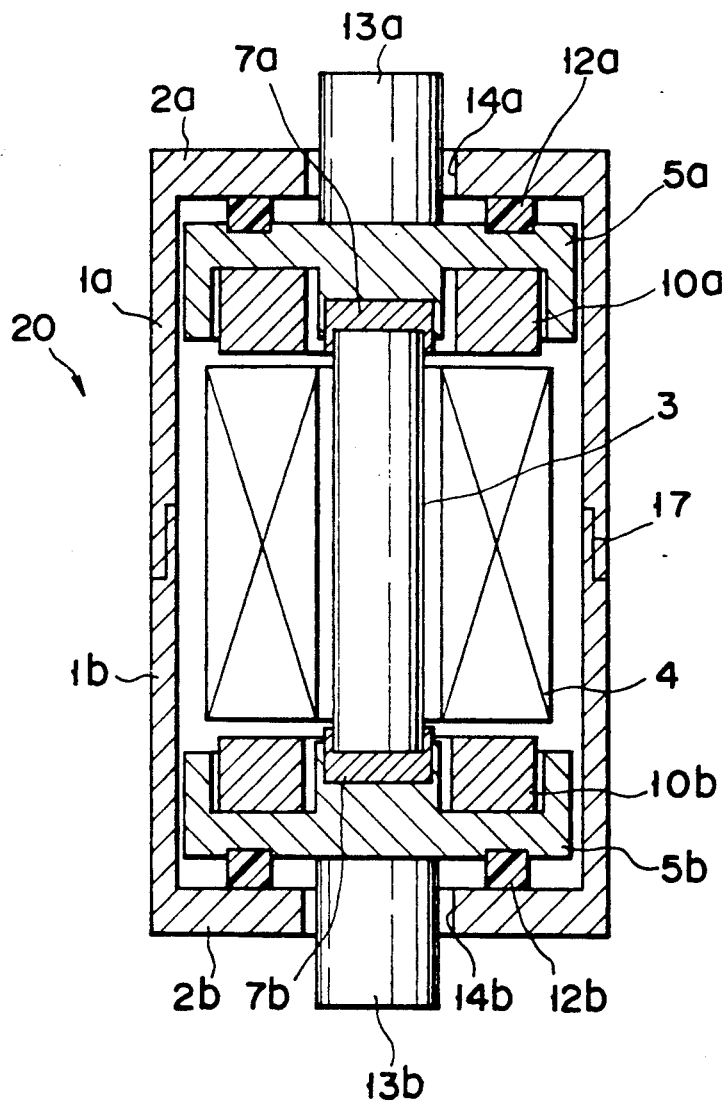
FIG. 5 is a cross-sectional view showing a vibrator to which a magnetostriction type actuator according to a second embodiment of the present invention is applied.

FIG. 5 is a cross-sectional view showing an example in which the magnetostriction type actuator is applied to a vibrator 20. The vibrator 20 comprises divided cylindrical yokes 1a and 1b. Each cylindrical yoke 1a, 1b has a disc-like seal portion 2a, 2b at one end. Displacement of a magnetostriction rod 3 situated within the combined yokes 1a and 1b is output from output ends 13a and 13b arranged at both ends of the rod 3. The output ends 13a and 13b project outwards through holes 14a and 14b formed in the seal portions 2a and 2b of yokes 1a and 1b. The output ends 13a and 13b are fixed to movable yokes 5a and 5b. Spacers 7a and 7b are interposed between the magnetostriction rod 3 and movable yokes 5a and 5b. Elastic members 12a an 12b are interposed between the seal portions 2a and 2b of yokes 1a and 1b and the movable yokes 5a and 5b.

Compression stress is applied to the magnetostriction rod 3 by adjusting a threaded engaging portion 17 formed at the connection part of divided cylindrical yokes 1a and 1b. The other structural parts are the same as have been mentioned in the description of the first embodiment.

According to the vibrator 20 of the second embodiment, the output ends 13a and 13b are mechanically fixed to desired objects to which vibration is transmitted. By supplying control current to a solenoid coil 4, the magnetostriction rod 3 is displaced. Consequently, a predetermined vibration is transmitted from the output ends 13a and 13b which are fixed to both ends of the rod 3 via spacers 7a and 7b and movable yokes 5a and 5b.

Third Embodiment

The vibrator 15 (FIG. 1) of the first embodiment and the vibrator 20 (FIG. 5) of the second embodiment are widely applicable, for example, to sound sources, vibratory wave-applied actuators, sonars, and acoustic communications. Further, by virtue of reverse magnetostrictive effect, a stress is applied to the output end(s) to generate a voltage in the solenoid coil; thus, the vibrators can be used as stress sensors.

Figure 6:
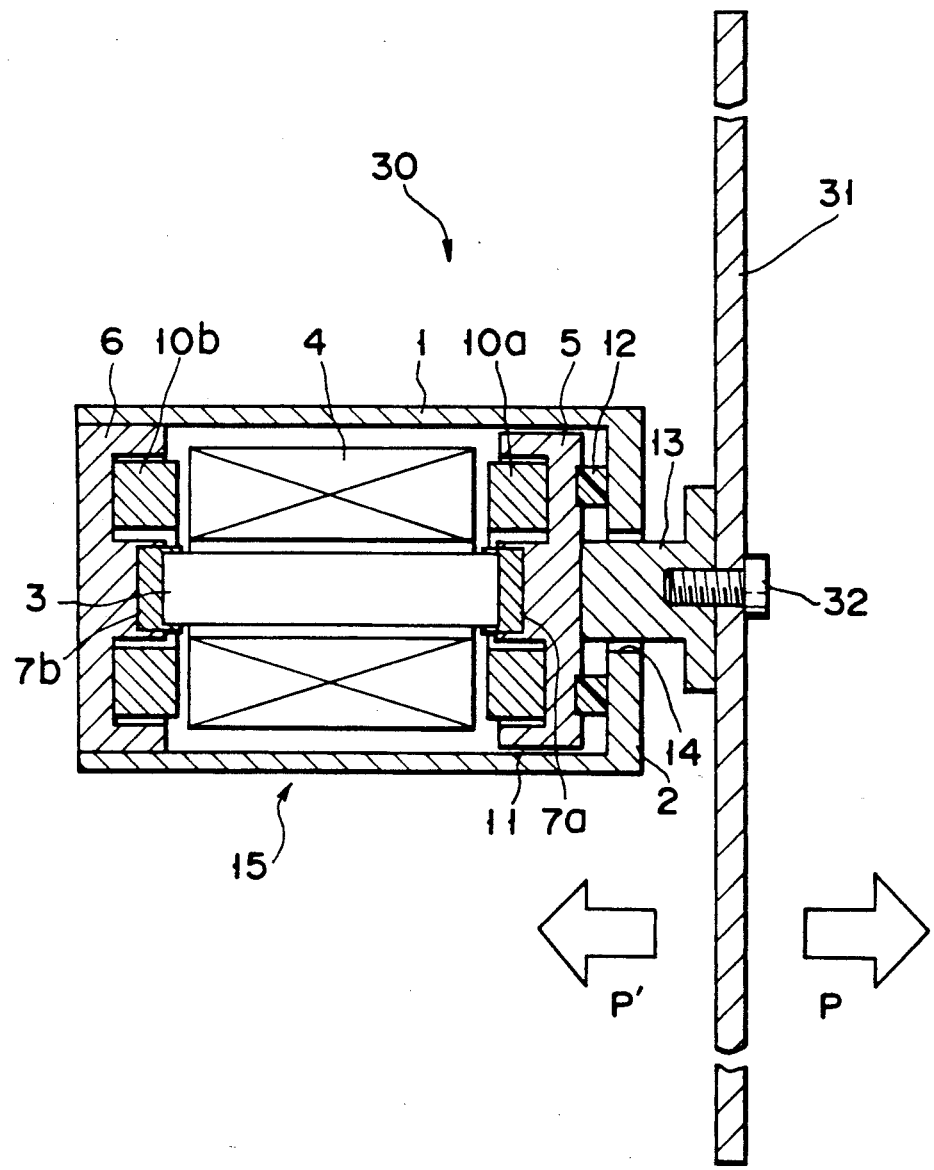
FIG. 6 is a cross-sectional view showing a vibrator to which a magnetostriction type actuator according to a third embodiment of the invention is applied.

FIG. 6 shows a structure of a solid sound generating apparatus, as an applied example of the vibrator 15 of the first embodiment. In FIG. 6, the structural elements similar to those shown in FIG. 1 are denoted by like reference numerals, and a detailed description thereof is omitted. The solid sound generating apparatus 30 is constituted such that the output end 13 of vibrator 15 is fixed by means of a bolt 32 to an object 31 to which vibration is transmitted.

According to the apparatus 30 having this structure, control current is supplied to the solenoid coil 4, thereby displacing the magnetostriction rod 3. A predetermined vibration resulting from the displacement is transmitted to the object 31 from the output end 13 fixed to the rod 3 with spacer 7a and movable yoke 5 interposed. Thus, sound P, P' is generated in directions of arrows. By supplying a sound signal to the coil 4, the apparatus 30 can be used as a sound source.

If objects to which oscillation is transmitted are fixed to both output ends 13a and 13b of vibrator 20 of the second embodiment (FIG. 5), sound can be generated from both sides of the apparatus.

Fourth Embodiment

The output end of the vibrator and the object to which vibration (displacement) is transmitted may be fixed simply in a mechanical manner, as in the third embodiment; however, the following fixing manner is preferable, for example, when intense vibratory wave is generated.

Figure 7:
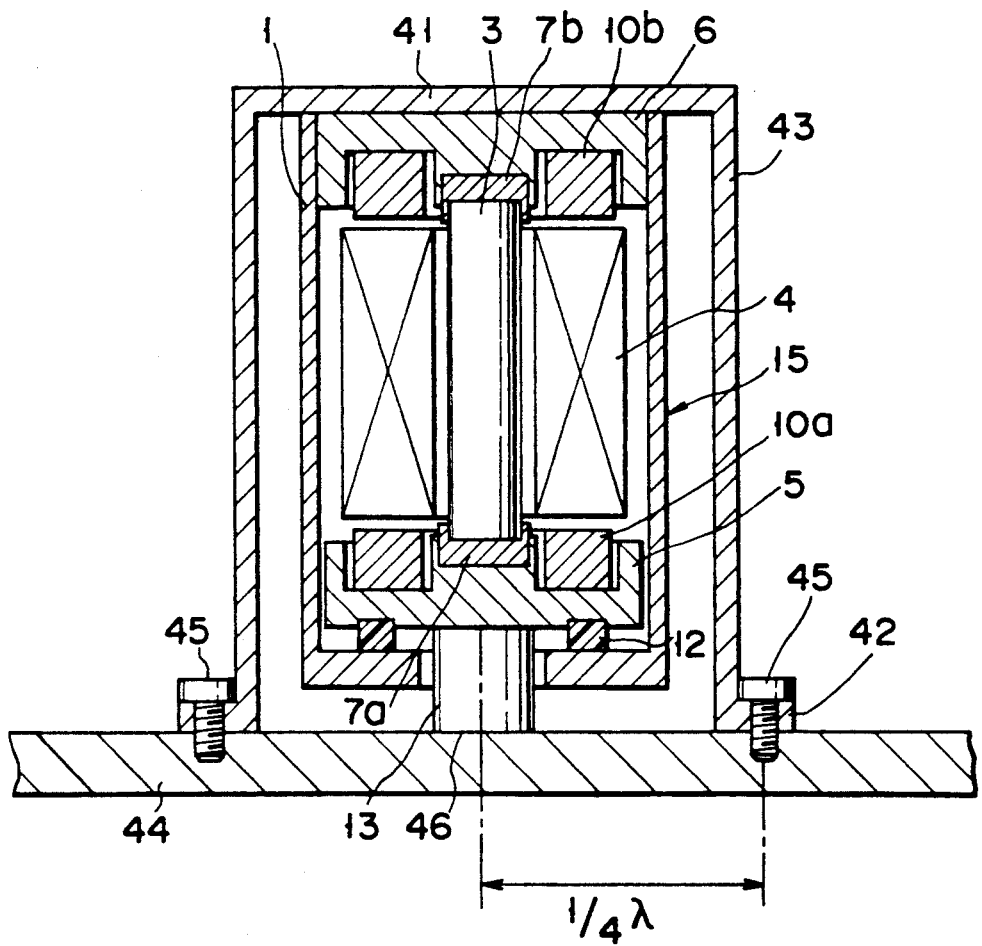
FIG. 7 is a cross-sectional view showing a vibrator to which a magnetostriction type actuator according to a fourth embodiment of the invention is applied.

FIG. 7 is a cross-sectional view showing the mode of fixation of the magnetostriction type actuator (vibrator) 15 and an object 44. In FIG. 7, the structural parts similar to those shown in FIG. 1 are denoted by like reference numerals, and a description thereof is omitted. The actuator 15 is stored within a cylindrical fixture 43 having a disc-like seal portion 41 at one end and an annular flange portion 42 at the other end. An output end 13 of actuator 15 is situated at the open end of the flange portion 42. An open end portion of cylindrical yoke 1 of actuator 15 and fixed yoke 6 are put in contact with the seal portion 41 of the fixture 43. The flange portion 42 of the fixture 43 is fixed to the object 44 by means of bolts 45, thereby bringing an end face 46 of output end 13 of actuator 15 into contact with the object 44.

Where the magnetostriction type actuator 15 and the object 44 to which displacement is transmitted are fixed in the above manner, control current is supplied to the coil 4 from an oscillator (not shown) thereby causing displacement. The displacement functions as an vibration source having such a wavelength as to set the distance between the output end 13 of actuator and fixture 43 to ¼λ in the bending oscillation state. Specifically, the displacement becomes a bending vibration due to the reaction force between the fixture 43 and object 44 in relation to the direction of extension of the output end 13 of actuator 15. Thus, displacement energy at the free end of actuator 15 is converted to reaction force, thereby efficiently and easily transmitting the displacement to the object 44. Even if the input power to the actuator 15 is relatively low, intense vibratory wave can be obtained. In addition, the size of actuator 15 can be reduced and the output of actuator 15 can be increased. Since the actuator 15 and object 44 can be fixed with relatively simple structure, the size of the entire structure can be reduced.

The above manner of fixing the magnetostriction type actuator and the object to which displacement is transmitted is applicable not only to the actuator shown in FIG. 1 but also to magnetostriction type actuators with various structures.

Fifth Embodiment

Figure 8:
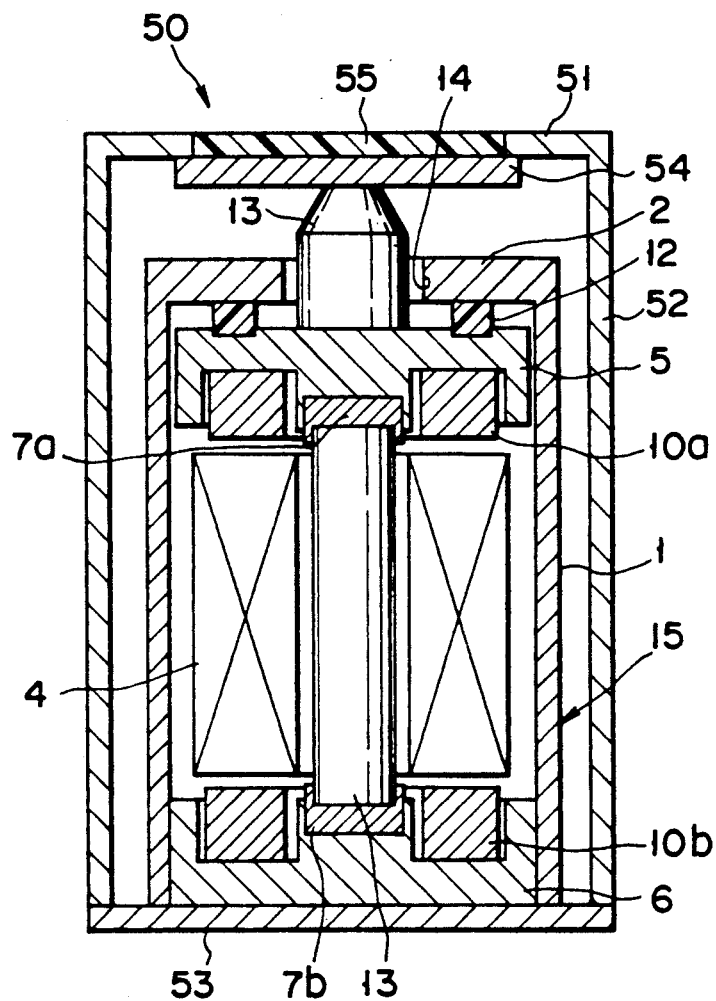
FIG. 8 is a cross-sectional view showing a vibrator unit to which a magnetostriction type actuator according to a fifth embodiment of the invention is applied.

FIG. 8 shows a structure of a vibration generating unit 50, as another applied example of the vibrator 15 of the first embodiment. In FIG. 8, the structural parts similar to those shown in FIG. 1 are denoted by like reference numerals, and a detailed description thereof is omitted.

The vibration generating unit 50 has a casing constituted by a cylindrical body 52 having a disc-like seal portion 51 at one end, and by a disc-like back plate 53 attached to the open end of the cylindrical body 52. Vibrator 15 is integrally housed in the casing. Output end 13 of the vibrator 15 is put in contact with the center part of a vibration plate 54 attached to the inner surface of the seal portion 51. The vibration plate 54 serves as an vibratory wave radiation surface. That part of the seal portion 51, which is contacted with the vibration plate 54, is provided with an elastic plate 55 for ensuring air-tightness. Taking the use in water into account, it is desirable that the casing and vibration plate 54 be formed of a corrosion-resistant material. The elastic plate 55 is normally made of a high molecular material such as urethane rubber or silicone rubber.

A vibration generator is constituted by arranging a plurality of vibration generating units 50 in an array. Since the vibration generator employs high-power, small-integral vibration generating units 50, a plurality of vibratory wave radiation surfaces can be arranged freely and easily. Thus, high directivity with high degree of freedom can be realized.

Figure 9A:
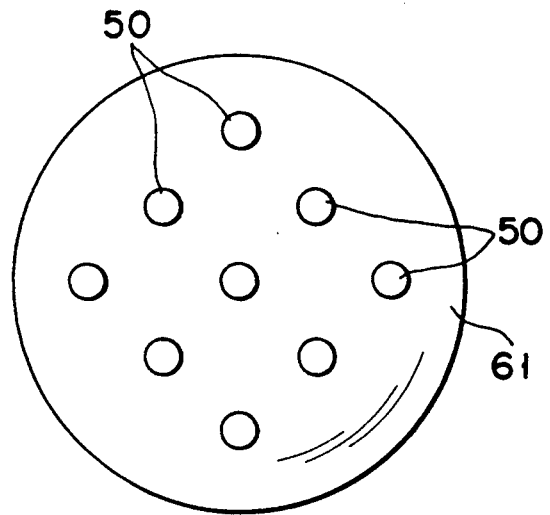
FIG. 9A is a plan view showing an applied example of the vibrator unit according to the fifth embodiment.
Figure 9B:
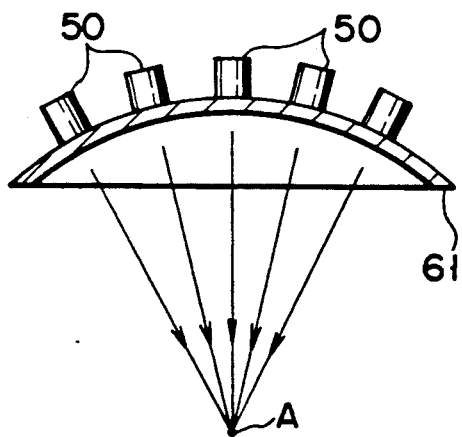
FIG. 9B is a cross-sectional view of the vibrator unit shown in FIG. 9A.

For example, as is shown in FIGS. 9A and 9B, oscillation generating units 50 are arranged at equal intervals on the outer surface of a spherical structure 61. The units 50 are driven by an electric signal generating source (not shown), thereby converging sound waves at point A. In this structure, propagation characteristics of vibratory waves must be fully considered. It is therefore desirable that a medium such as water be provided between the point A and the spherical structure 61.

Figure 10:
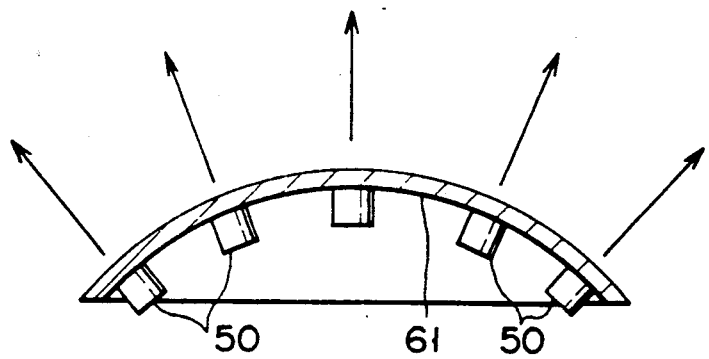
FIG. 10 is a cross-sectional view showing another applied example of the vibrator unit according to the fifth embodiment.

In addition, as is shown in FIG. 10, a plurality of vibration generating units 50 may be arranged on the inner surface of the spherical structure 61 so as to direct the vibratory wave radiation surfaces outwards. Thus, nondirectional vibratory waves can be generated.

Figure 11:
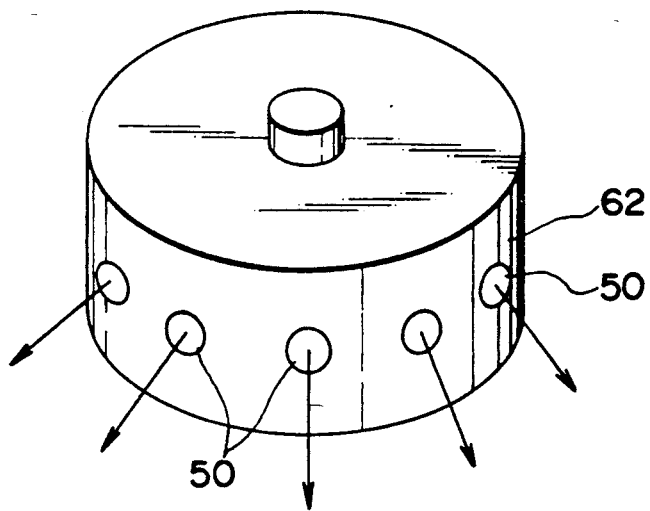
FIG. 11 is a perspective view showing another applied example of the vibrator unit according to the fifth embodiment.

Further, by arranging the vibration generating units on the spherical structure, vibratory waves can be propagated omnidirectionally. Specifically, a plurality of vibration generating units 50 are arranged on the inner peripheral surface of a cylindrical container 62, as shown in FIG. 11, thereby propagating vibratory waves omnidirectionally at 360°, as indicated by arrows. This technique is applicable to underwater sound sources, sonars, etc.

Sixth Embodiment

Figure 12:
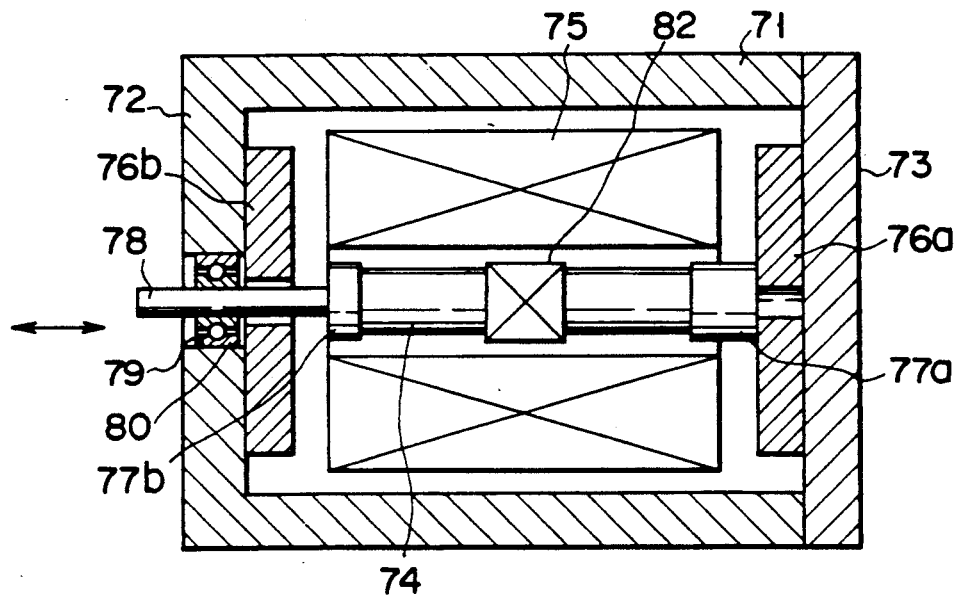
FIG. 12 is a cross-sectional view showing a magnetostriction type actuator according to a sixth embodiment of the invention, which is used for fine displacement.
Figure 13:
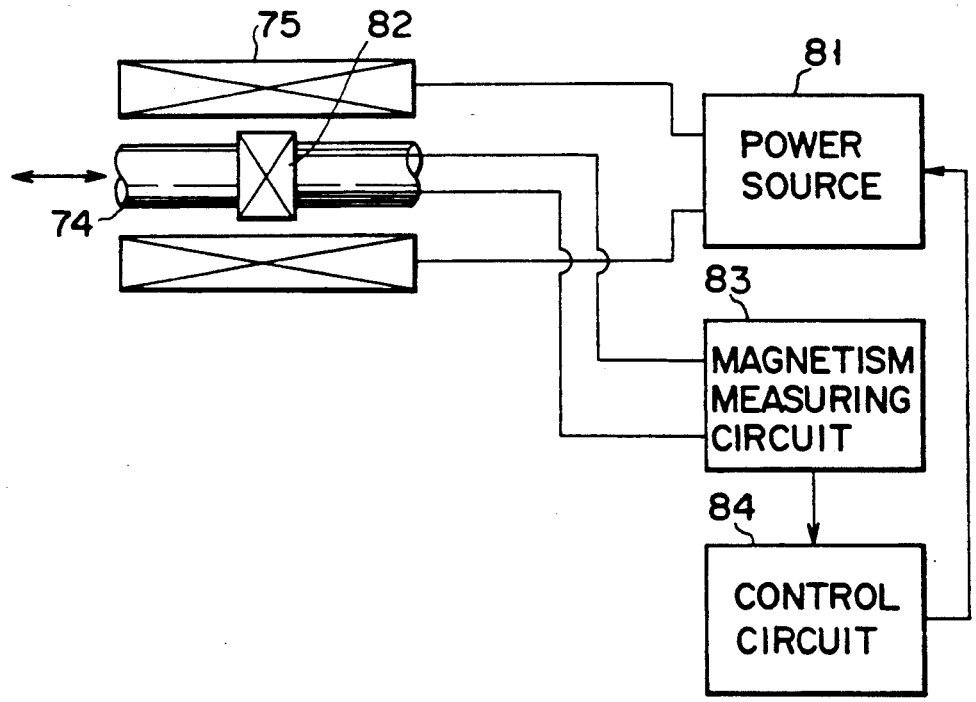
FIG. 13 is a schematic diagram showing a drive circuit used in the actuator shown in FIG. 12.

FIG. 12 is a cross-sectional view showing a magnetostriction type actuator used for fine displacement, according to a sixth embodiment of the invention. FIG. 13 is a schematic diagram showing a drive circuit used for the magnetostriction type actuator according to FIG. 12. Reference numeral 71 denotes a cylindrical yoke having a disc-like seal portion 72 at one end. A disc-like backing yoke 73 is fixed to the open end face of the yoke 71 by means of screws (not shown) or the like. The cylindrical yoke 71 and backing yoke 73 constitute a closed magnetic circuit for a solenoid coil and permanent magnets (described later). A magnetostriction rod 74 is provided within the cylindrical yoke 71 along the longitudinal axis of the yoke 71. The rod 74 is made of a giant magnetostrictive alloy, e.g. $Tb_{0.3}Dy_{0.7}Fe_{1.9}$.

A solenoid coil 75, serving as first magnetic field generating means for displacing the magnetostriction rod 74, is located between the magnetostriction rod 74 and cylindrical yoke 71. The solenoid coil 75 has a length which is equal to 1.1 times the length of the magnetostriction rod 74, thus enabling a magnetic field to be applied uniformly to the magnetostriction rod 74. The coil 75 has a multilayer uniform winding structure wherein the coil 75 extends from one end of rod 74 to the other end, with a predetermined gap kept between the rod 74 and coil 75. Annular permanent magnets 76a and 76b, serving as second magnetic field generating means, are provided on the inner surfaces of the backing yoke 73 and the seal portion 72 of cylindrical yoke 71. The permanent magnets 76a and 76b applies a predetermined DC magnetic bias to the magnetostriction rod 74. Thereby establishing a linear relationship between the control current to the solenoid coil 75 and the displacement of the magnetostriction rod 74.

One end (the right end in FIG. 12) of the magnetostriction rod 74 and the permanent magnet 76a is fixed by means of a spacer 77a interposed therebetween. The other end (the left end) of the rod 74 is connected to a stay 78 by means of a spacer 77b interposed therebetween. The stay 78 is moved in the direction of the arrow shown in FIG. 12 in accordance with the displacement of the magnetostriction rod 74. The stay 78 projects outwards through a hole 79 formed in the disc-like seal portion 72 of cylindrical yoke 71. A bearing 80 for eliminating a radial stress of the rod 74 is disposed in the hole 79. The stay 78 serves as a joint with a driven device such as an XY stage (not shown). The solenoid coil 75 is connected to a power source 81 for supplying control current to the coil 75, as shown in FIG. 13. A detecting coil 82 having several-ten turns for detecting a variation in magnetic characteristic is wound around the magnetostriction rod 74. The detecting coil 82 is connected to a magnetism measuring circuit 83 for detecting a variation in magnetic characteristic of the magnetostriction rod 74. The magnetism measuring circuit 83 is connected to a control circuit 84. The control circuit 84 is connected to the power source 81.

Figure 14:
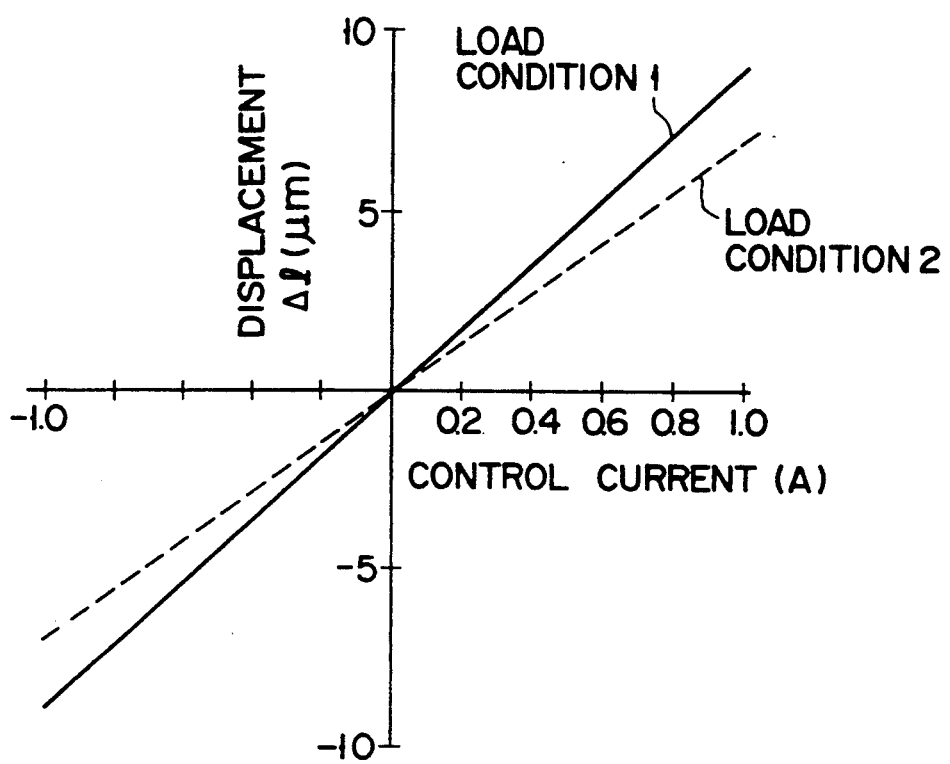
FIG. 14 is a characteristic graph showing a relationship between the control current supplied to the solenoid coil of the actuator of the sixth embodiment and the displacement of a magnetostriction rod of the actuator
Figure 15:
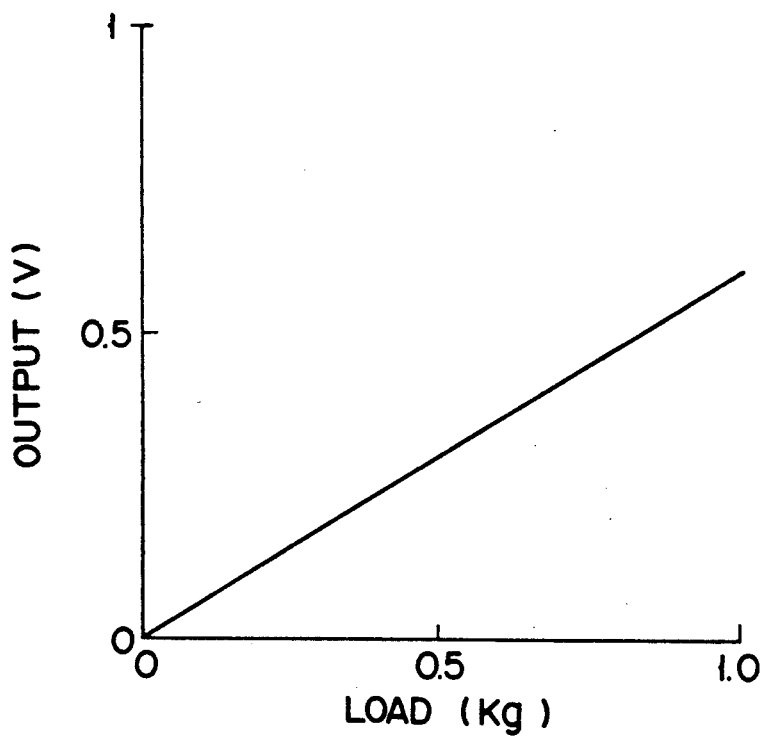
FIG. 15 is a characteristic graph showing a detection value of a load in the actuator of the sixth embodiment.

The control circuit 84 has a function of determining a load condition of the magnetostriction rod 74, on the basis of the output (magnetic characteristic variation detection information) from the magnetism measuring circuit 83, and a function of adjusting (setting) a control current supplied from the power source 81 to the solenoid coil 75, on the basis of the relationship between the displacement of the rod 74 matching the load condition and the control current supplied from the power source 81. FIG. 14 is a characteristic graph showing a relationship between the control current supplied from the power source 81 to the solenoid coil 75 of the actuator and the displacement of the magnetostriction rod 74. As is shown in FIG. 14, the relationship between the control current and the displacement varies, depending on the load conditions 1 and 2. On the other hand, FIG. 15 shows a relationship between the load and output, which is found by the detecting coil 82 for detecting magnetic characteristic variation and the magnetism measuring circuit 83. As seen from the relationship shown in FIG. 15, the control circuit 84 has the two functions. That is, the control circuit 84 has the function of determining a load condition of the magnetostriction rod 74, on the basis of the output (magnetic characteristic variation detection information) from the magnetism measuring circuit 83, and the function of adjusting (setting) the control current supplied from the power source 81 to the solenoid coil 75, on the basis of the relationship between the displacement of the rod 74 matching the load condition and the control current supplied from the power source 81 (e.g. the displacement/control current characteristic line of load condition 1 shown in FIG. 14).

According to the magnetostriction type actuator having the above structure, when a control current is supplied from the power source 81 to the solenoid coil 75 to drive and displace the magnetostriction rod 74, the load information of the rod 74 can be detected by the detecting coil 82 wound around the rod 74 and the magnetism measuring circuit 83. A detection signal from the circuit 83 is output to the control circuit 84. The control circuit 84 controls the power source 81 in a feed-back manner, thus enabling the power source 81 to supply a stable control current to the solenoid coil 75. Thus, the driven device such as an XY stage can be driven and displaced precisely and stably, irrespective of the load condition.

Since the load information of the magnetostriction rod 74 can be detected by the detecting coil 82 and the magnetism measuring circuit 83 connected to the coil 82, the magnetostriction type actuator having a dynamic amount sensor can be realized.

In the sixth embodiment, the detecting coil 82 wound around the rod 74 is used as detection means for detecting a magnetic characteristic variation of the rod 74; however, as shown in FIG. 16, the solenoid coil 75 serving as magnetic field generating means may be used also as the detection means. Specifically, in FIG. 16, a bridge circuit 85 is connected to the coil 75 in parallel to the power source 81. An AC block resistor L is interposed between the solenoid coil 75 and the power source 81. A DC block capacitor C is interposed between the coil 75 and the bridge circuit 85. The bridge circuit 85 is connected to the power source 81 via the control circuit 84.

According to the structure shown in FIG. 16, when a control current is supplied from the power source 81 to the solenoid coil 75, a variation in magnetic characteristic in the magnetostriction rod 74 can be detected by the bridge circuit 85 as an impedance variation. The detected value (load information) is output to the control circuit 84. The control circuit 84 controls the power source 81 thereby enabling the power source 81 to supply a stable control current to the solenoid coil 75. Thus, like the sixth embodiment, the driven device such as an XY stage can be driven and displaced precisely and stably, irrespective of the load condition. In addition, since the detecting coil can be dispensed with, the structure of the actuator can be made simpler.

Figure 17:
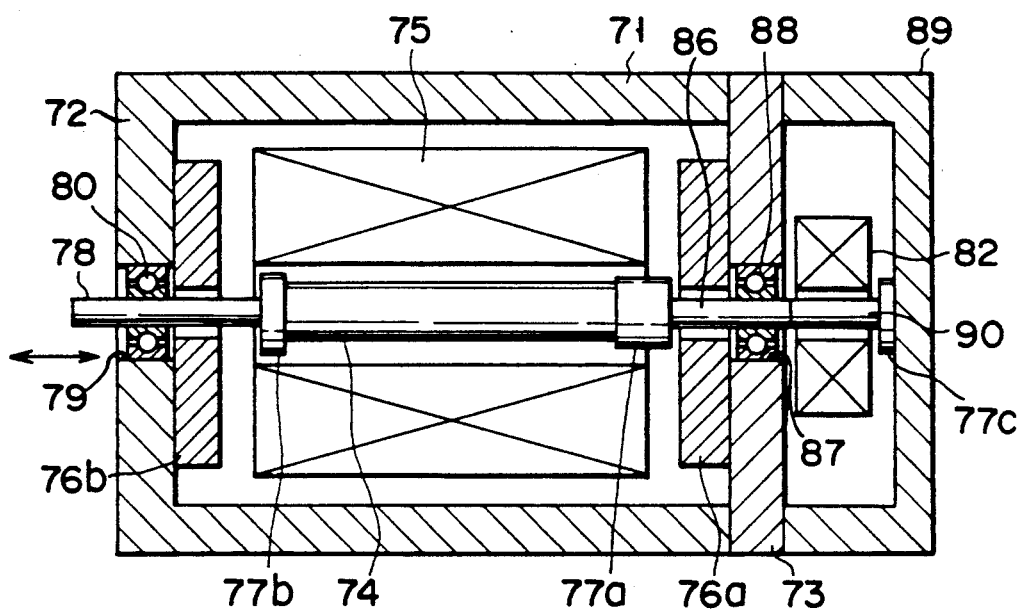
FIG. 17 is a cross-sectional view showing a modification of the actuator according to the sixth embodiment.

Furthermore, a structure shown in FIG. 17 may be adopted. In FIG. 17, a coupling rod 86 is attached to a spacer 77a provided at the right end of magnetostriction rod 74. The coupling rod 86 is projected outwards through a hole 87 formed in a disc-like packing yoke 73. A bearing 88 for eliminating a radial stress in the coupling rod 86 is disposed in the hole 87. A cylindrical casing 89 with an open end is attached to the packing yoke 73 so as to cover the coupling rod 86 projecting from the hole 87 of packing yoke 73. A dummy magnetostriction rod 90 is disposed within the casing 89. One end of the dummy magnetostriction rod 90 is abutted on an end face of the projected coupling rod 86. The other end of the dummy magnetostriction rod 90 is fixed to the rear face of the casing 89 with a spacer 77c interposed. A detecting coil 82 is wound around the dummy magnetostriction rod 90.

According to the structure shown in FIG. 17, the detecting coil 82 is situated in the place (within casing 89) which is free from influence of magnetic bias. Thus, the controllability of the actuator is remarkably enhanced. In this case, it is not necessary to apply DC magnetic bias to the dummy magnetostriction rod 90 in advance. Rather, a variation in magnetic characteristic in relation to the load applied from stay 78 is obtained as an emphasized value. The reason for this is that a magnetic characteristic variation in a rotation magnetization region in the magnetization process is small owing to application of magnetic bias, whereas the magnetic characteristic variation in a magnetic domain wall movement region is large. Thus, where the magnetic characteristic variation is detected by, for example, a minor loop, the variation is efficiently detected as an emphasized value if no magnetic bias is applied.

The provision of the bearing 79 (88) makes it possible to use the actuator in cases other than the case where a vertical load is applied. Since influence of a transverse load (shearing stress) to the magnetostriction rod 74 and dummy magnetostriction rod 90 is reduced, practical advantages can be attained.

Seventh Embodiment

FIG. 18 is a cross-sectional view showing a magnetostriction type actuator for fine displacement, according to a seventh embodiment of the invention, and FIG. 19 is a schematic diagram showing a drive circuit for driving the actuator shown in FIG. 18. The structural parts similar to those shown in FIG. 12 are denoted by like reference numerals.

The magnetostriction type actuator has a thermocouple 91 for detecting a temperature variation in magnetostriction rod 74. The thermocouple 91 is fixed at a middle point on the outer peripheral surface of magnetostriction rod 74. The thermocouple 91 is connected to a temperature detection circuit 92. The circuit 92 is connected to a control circuit 93. The control circuit 93 finds a thermal deformation amount of the magnetostriction rod 74, on the basis of the temperature information obtained by the temperature detection circuit 92, and controls power source 81 in a feed-back manner to supply control current to solenoid coil 75.

According to this actuator, when a control current is supplied from the power source 81 to the solenoid coil 75 to drive and displace the magnetostriction rod 74, the temperature information of magnetostriction rod 74 can be detected by the thermocouple 91 fixed to the magnetostriction rod 74 and the temperature detection circuit 92 connected to the thermocouple 91. A detection signal from the detection circuit 92 is output to the control circuit 93. The control circuit 93 finds a thermal deformation amount in accordance with a temperature variation of the magnetostriction rod 74. Since the control current, which is supplied from the power source 81 to the solenoid coil 75, is increased and decreased in accordance with the deformation amount, the driven device such as an XY stage can be driven and displaced precisely and stably, irrespective of the temperature variation.

In order to confirm the characteristic of the magnetostriction type actuator of the seventh embodiment, the temperature information of magnetostriction rod 74 was obtained by the thermocouple 91 and temperature detection circuit 92 connected to the thermocouple 91, and the obtained information was output to the control circuit 93 for feed-back control. Thus, a displacement of the magnetostriction rod in relation to the temperature variation of the magnetostriction rod was found. The result is shown in FIG. 20. As is obvious from FIG. 20, it was confirmed that the actuator (characteristic line A) of the seventh embodiment 7 maintained a stable displacement, without being influenced by the temperature variation of the magnetostriction rod. By contrast, in the case of a magnetostriction type actuator (comparative example: characteristic line B), which was not provided with the thermocouple, temperature detection circuit or control circuit, it was found that the displacement increased in accordance with the temperature variation of the magnetostriction rod and the increase was equal to the thermal expansion coefficient of the magnetostriction rod.

In the above actuator, the thermal deformation amount according to the temperature variation of the magnetostriction rod 74 is found by the thermocouple 91, temperature detection circuit 92 and control circuit 93. In accordance with the deformation amount, the control current supplied from the power source 81 to the solenoid coil 75 is increased and decreased. In addition to this function, there may be provided some means for keeping constant the temperature of the entire magnetic circuit (including magnetostriction rod 74). Thereby, more precise and stable fine displacement and drive can be realized.

In the seventh embodiment, the thermocouple was used as temperature detection means; however, PTC or other detection means may be used. The number of thermocouples attached to the magnetostriction rod is not limited to one; two or more thermocouples may be attached along the longitudinal axis of the magnetostriction rod. In this case, obtained plural temperature data are averaged, thereby enhancing the positioning precision.

Eighth Embodiment

FIG. 21 is a cross-sectional view showing a magnetostriction type actuator for fine displacement, according to an eighth embodiment of the invention, and FIG. 22 is a schematic diagram showing a drive circuit used for the actuator shown in FIG. 21. The structural parts similar to those shown in FIG. 12 are denoted by like reference numerals, and a detailed description thereof is omitted.

This actuator has a resistance wire strain gauge 94 for detecting a strain of magnetostriction rod 74. The gauge 94 is attached to a middle point on the outer peripheral surface of the rod 74. The gauge 94 is connected to a strain amplifier 95. The strain amplifier 95 is connected to a control circuit 96. The control circuit 96 compares the strain information of the strain amplifier 95 with a displacement to be set. On the basis of the comparison value, the control circuit 96 controls, in a feed-back manner, the power source 81 for supplying a control current to solenoid coil 75.

Figure 23:
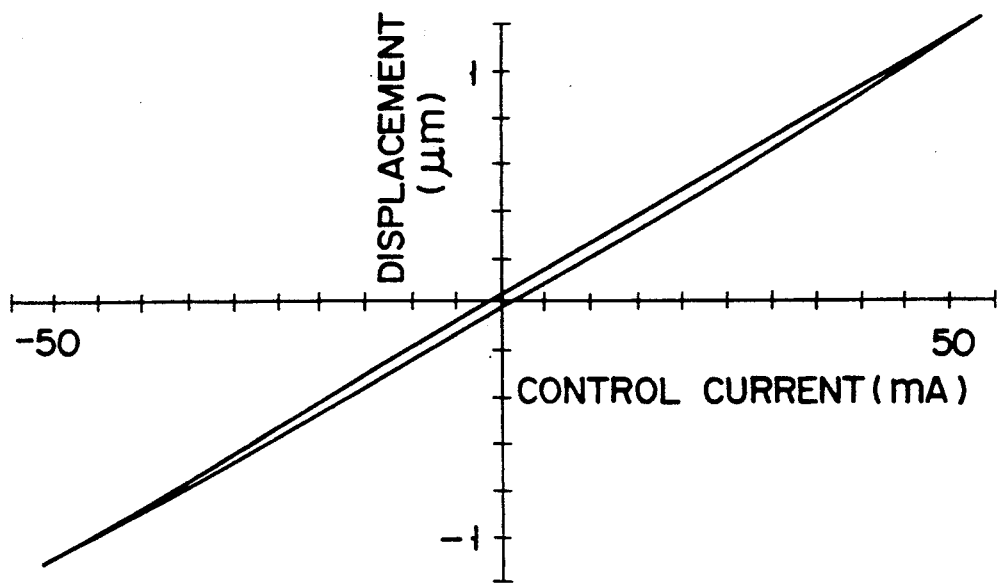
FIG. 23 is a characteristic graph showing a relationship between the control current supplied to the solenoid coil of the actuator and the displacement detected by a non-contact type displacement gauge attached to the magnetostriction rod of the actuator.
Figure 24:
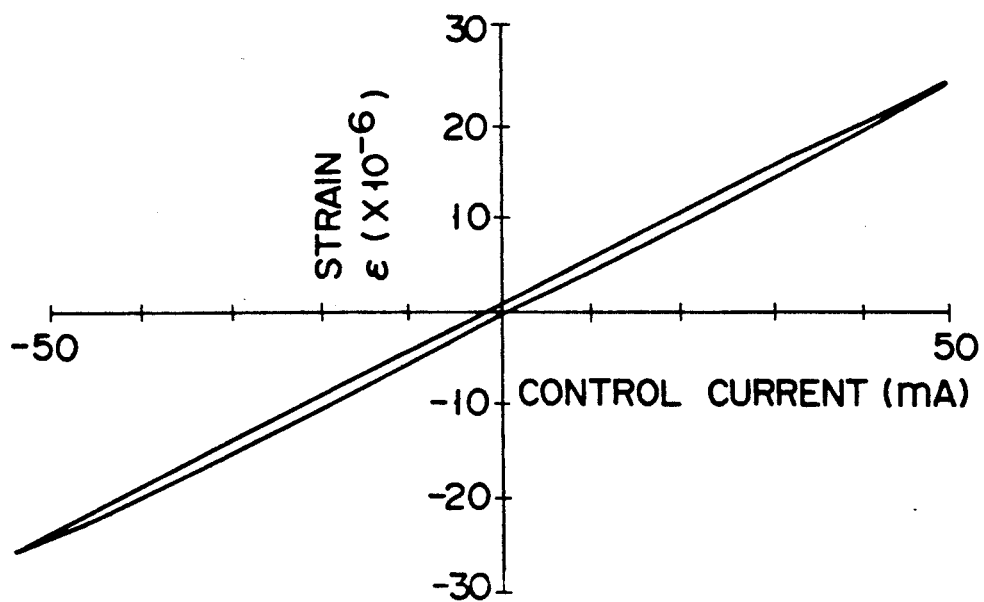
FIG. 24 is a characteristic graph showing a relationship between the control current supplied to the solenoid coil of the actuator of the eighth embodiment and the strain detected by the strain gauge attached to the magnetostriction rod of the actuator.

According to this actuator, when a control current is supplied from the power source 81 to the solenoid coil 75 to drive and displace the magnetostriction rod 74, the strain (absolute value of displacement) of the rod 74 can be precisely detected by the strain gauge 94 attached to the rod 74. Specifically, as is shown in FIGS. 23 and 24 (characteristic graphs, explained below), the stain (absolute value of displacement) of the magnetostriction rod 74 can be detected precisely. More specifically, FIG. 23 is a characteristic graph showing a relationship between the control current supplied to the solenoid coil 75 and the displacement detected by a non-contact type displacement gauge attached to and end of the actuator. FIG. 24 is a characteristic graph showing a relationship between the control current supplied to the solenoid coil 75 and the strain detected by the strain gauge 94 attached to the magnetostriction rod 74. As is shown in FIG. 23, the displacement of the magnetostriction rod measured by the non-contact type displacement sensor is proportional to the control current. For example, the displacement per unit current is 22.4 nm/mA. On the other hand, as is shown in FIG. 24, the strain of the magnetostriction rod 74 measured by the strain gauge 94 is proportional to the control current. For example, the strain per unit current is 25.5 nm/mA. As a result, it is found that the strain of the rod 74 measured by the strain gauge 94 is closely related to the displacement of the rod 74, and the strain (absolute value of displacement) of the rod 74 can be precisely detected. The error between the displacement and strain is mainly due to the location (center of rod 74) of the strain gauge 94. Thus, the strain value similar to the displacement value can be obtained by converting the strain shown in FIG. 24 on the basis of the displacement shown in FIG. 23. In addition, the displacement of the magnetostriction rod 74 can be detected more precisely by attaching a plurality of strain gauges on the rod 74 along its longitudinal axis and averaging the strain values obtained by the gauges.

As has been described above, the strain detected by the strain gauge 94 is amplified by the strain amplifier 95. The obtained strain information is output to the control circuit 96. The control circuit 96 compares the strain information with the displacement to be set. On the basis of the comparison value, the control circuit 96 controls the power source 81 in a feed-back manner, thereby increasing and decreasing the control current supplied from the power source 81 to the solenoid coil 75. Thus, the driven device such as an XY stage can be driven and displaced precisely and stably, irrespective of thermal disturbance, vibration, friction, etc.

Regarding the magnetostriction actuators of the sixth to eighth embodiments, the displacement generated in the magnetostriction rod may be utilized in this state, or may be utilized to drive another object.

It is possible to provide the vibrator or vibrator unit of the first to fifth embodiments with detection means for detecting material properties (magnetic property, temperature, strain, etc.) which may influence a strain variation of the magnetostriction rod. On the basis of the detection signal output from the detection means, the control circuit may control the control current to the magnetic field generating means (e.g. solenoid coil).

As has been described above, the present invention can provide a magnetostriction type actuator capable of reducing an input power loss and increasing an output, which actuator is reduced in size and is applicable to a vibrator, etc.

Furthermore, the present invention can provide a magnetostriction type actuator capable of being finely displaced and driven with high stability and controllability, irrespective of thermal disturbance, load, etc. which affect a strain variation of a magnetic substance.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetostriction type actuator comprising:
   displacement generating means formed of a magnetic substance having magnetostriction;
   a movable member fixed to said displacement generating means, which movable member is movable in the direction of displacement of said displacement generating means;
   magnetic field generating means, provided around said displacement generating means, for applying a magnetic field to said displacement generating means;
   a magnetic circuit component for constituting, along with said movable member, a main part of a closed magnetic circuit, within which magnetic circuit component said displacement generating means and said magnetic field generating means are stored; and
   an elastic member, disposed within said magnetic circuit component, for applying a compression force to said displacement generating means via said movable member in the direction of displacement of said displacement generating means.

2. The actuator according to claim 1, wherein said actuator is operated in a vibration mode.

3. The actuator according to claim 1, wherein said magnetic field generating means comprises first magnetic field generating means for generating a displacement in said displacement generating means and second magnetic field generating means for applying a magnetic bias.

4. The actuator according to claim 1, further comprising detection means for detecting a magnetic characteristic of said displacement generating means, said detection means being connected to control means for controlling a magnetic field applied from the magnetic field generating means to said displacement generating means, on the basis of a detection signal supplied from the detection means.

5. The actuator according to claim 1, further comprising detection means for detecting the temperature of said displacement generating means, said detection means being connected to control means for controlling a magnetic field applied from the magnetic field generating means to said displacement generating means, on the basis of a detection signal supplied from the detection means.

6. The actuator according to claim 1, further comprising detection means for detecting the strain of said displacement generating means, said detection means being connected to control means for controlling a magnetic field applied from the magnetic field generating means to said displacement generating means, on the basis of a detection signal supplied from the detection means.

7. The actuator according to claim 1, wherein said magnetic substance consists of a magnetostrictive alloy composed of a rare earth metal-transition metal base Laves-phase intermetallic compound.

8. The actuator according to claim 6, wherein said magnetostrictive alloy has a composition which satisfies the atomic ratio of $$R(Fe_{1-x-y}Co_xM_y)_z$$

(where R is at least one element selected from rare earth metals including yttrium; M is at least one selected from the group consisting of Ni, Mn, Mg, Al, Ga, Zn, V, Zr, Hf, Ti, Nb, Cu, Ag, Sn, Mo, Si and B; and x, y and z represent $0 \leq x \leq 0.95$, $0 \leq y \leq 0.6$, and $1.5 \leq z \leq 4.0$).

9. A magnetostriction type actuator comprising:
displacement generating means formed of a magnetic substance having magnetostriction;
magnetic field generating means comprising first magnetic field generating means for a displacement in said displacement generating means and second magnetic field generating means for applying a magnetic bias;
detection means for detecting a factor which influences a strain variation in said displacement generating means; and
control means, connected to the detection means, for controlling a magnetic field applied from the magnetic field generating means to said displacement generating means, on the basis of a detection signal supplied from the detection means.

10. The actuator according to claim 9, wherein said detection means detects a magnetic characteristic of said displacement generating means.

11. The actuator according to claim 9, wherein said detection means detects the temperature of said displacement generating means.

12. The actuator according to claim 9, wherein said detection means detects a strain of said displacement generating means.

13. The actuator according to claim 9, wherein said control means controls a control current supplied to the magnetic field generating means, thereby controlling a magnetic field applied to said displacement generating means by the magnetic field generating means.

14. A magnetostriction type actuator comprising:
displacement generating means formed of a magnetic substance having magnetostriction;
magnetic field generating means, provided around said displacement generating means, for applying a magnetic field to said displacement generating means;
detection means for detecting a magnetic characteristic of said displacement generating means, said detection means including a coil wound around said displacement generating means and surrounded by said magnetic field generating means; and
control means, connected to the detection means, for controlling a magnetic field applied from the magnetic field generating means to said displacement generating means, on the basis of a detection signal supplied from the detection means.

15. A magnetostriction type actuator comprising:
displacement generating means formed of a magnetic substance having magnetostriction;
a movable member fixed to said displacement generating means, said movable member being movable in the direction of displacement of said displacement generating means;
magnetic field generating means comprising at least two components, provided around said displacement generating means, for applying magnetic field to said displacement generating means; and
a magnetic circuit component for constituting, along with said movable member, a main part of a closed magnetic circuit, within which said magnetic circuit component, said displacement generating means and said magnetic field generating means are stored.

* * * * *